US010923360B2

(12) United States Patent
Katsunuma

(10) Patent No.: US 10,923,360 B2
(45) Date of Patent: Feb. 16, 2021

(54) METHOD OF ETCHING FILM AND PLASMA PROCESSING APPARATUS

(71) Applicant: TOKYO ELECTRON LIMITED, Tokyo (JP)

(72) Inventor: Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/212,847

(22) Filed: Dec. 7, 2018

(65) Prior Publication Data
US 2019/0362984 A1 Nov. 28, 2019

(30) Foreign Application Priority Data

May 28, 2018 (JP) .................................. 2018-101397

(51) Int. Cl.
*H01L 21/311* (2006.01)
*H01L 21/02* (2006.01)

(52) U.S. Cl.
CPC .. *H01L 21/31138* (2013.01); *H01L 21/02238* (2013.01); *H01L 21/02244* (2013.01)

(58) Field of Classification Search
None
See application file for complete search history.

(56) References Cited

U.S. PATENT DOCUMENTS

| 4,343,677 A * | 8/1982 | Kinsbron | C23F 4/00 438/704 |
| 7,294,580 B2 * | 11/2007 | Yun | H01L 21/31116 216/67 |
| 2010/0285671 A1 * | 11/2010 | Ji | G03F 7/427 438/723 |
| 2014/0120726 A1 * | 5/2014 | Nemani | H01L 21/3105 438/694 |
| 2014/0120733 A1 * | 5/2014 | Cheung | G03F 7/427 438/725 |
| 2014/0187035 A1 * | 7/2014 | Posseme | H01L 21/02063 438/618 |
| 2016/0307775 A1 * | 10/2016 | Lee | H01L 21/31144 |
| 2016/0379834 A1 * | 12/2016 | Katsunuma | H01L 21/31116 438/720 |
| 2017/0011939 A1 * | 1/2017 | Tabata | H01L 21/76813 |
| 2017/0323825 A1 * | 11/2017 | Tomura | H01L 23/535 |

FOREIGN PATENT DOCUMENTS

| JP | 2009-049141 A | 3/2009 |
| JP | 2012-204668 A | 10/2012 |
| JP | 2015-012178 A | 1/2015 |

* cited by examiner

*Primary Examiner* — Allan W. Olsen
(74) *Attorney, Agent, or Firm* — Rothwell, Figg, Ernst & Manbeck, P.C.

(57) ABSTRACT

In a method of etching a film having a side wall surface and a bottom surface that defines an opening, a precursor layer is formed on the film and the film is etched by a chemical species generated from a processing gas. A protection region is formed from the precursor layer by the chemical species generated from a plasma or the processing or a separate chemical species from the plasma or processing gas while the film is being etched.

28 Claims, 7 Drawing Sheets

METHOD OF ETCHING FILM AND PLASMA PROCESSING APPARATUS

CROSS-REFERENCE TO RELATED APPLICATIONS

This application is based on and claims priority from Japanese Patent Application No. 2018-101397 filed on May 28, 2018 with the Japan Patent Office, the disclosure of which is incorporated herein in its entirety by reference.

TECHNICAL FIELD

An exemplary embodiment of the present disclosure relates to a method of etching a film and a plasma processing apparatus.

BACKGROUND

In manufacturing an electronic device, plasma etching is performed on a film. In the plasma etching, plasma is produced from a gas in a chamber. A substrate disposed in the chamber is etched by a chemical species generated from the plasma.

In the plasma etching, in order to suppress an opening formed in the film from expanding in a lateral direction (i.e., a direction orthogonal to the film thickness direction), a protection region may be formed on a side wall surface of a film defining the opening. Technologies including the processes of forming the protection region and etching the film are disclosed in, for example, Japanese Laid-Open Patent Publication Nos. 2012-204668, 2009-049141, and 2015-012178.

In the technologies disclosed in Japanese Laid-Open Patent Publication Nos. 2012-204668, 2009-049141, and 2015-012178, an organic film is etched. In the technologies disclosed in Japanese Laid-Open Patent Publication Nos. 2012-204668 and 2009-049141, a protection region containing silicon is formed on a side wall surface by sputtering. The protection region protects the organic film from an oxygen species that etches the organic film. In the technology disclosed in Japanese Laid-Open Patent Publication No. 2015-012178, the organic film is etched by plasma etching using a gas containing carbonyl sulfide, oxygen, and chlorine. When plasma is produced, a sulfur species and a chemical species of silicon chloride are produced. The sulfur species and the chemical species of silicon chloride form the protection region on the side wall surface. In the technology disclosed in Japanese Laid-Open Patent Publication No. 2015-012178, the protection region is formed simultaneously with the etching of the organic film.

SUMMARY

According to an embodiment, a method of etching a film is provided. The film is an organic film. The organic film has a side wall surface and a bottom surface that define an opening. The method includes (i) forming a precursor layer on the organic film, and (ii) etching the organic film by an oxygen species from an oxygen-containing gas. In the step of etching the organic film, the precursor layer is oxidized by the oxygen species from the oxygen-containing gas to form a protection region.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

Figure 1:
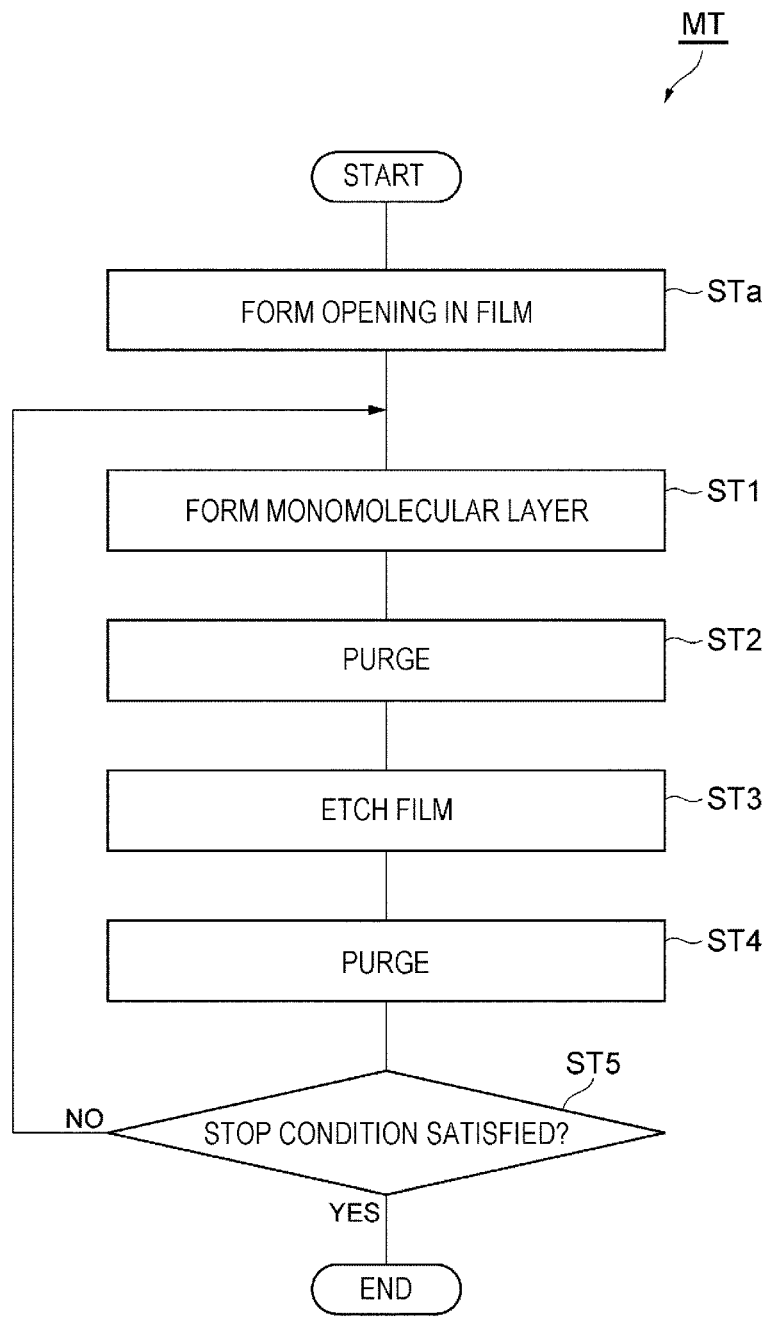
FIG. 1 is a flowchart illustrating a method of etching a film according to an embodiment.

In the following detailed description, reference is made to the accompanying drawing, which form a part hereof. The illustrative embodiments described in the detailed description, drawing, and claims are not intended to be limiting, but are provided as examples. Other embodiments may be utilized, and other changes may be made without departing from the spirit or scope of the subject matter presented here.

The protection region, which protects the side wall surface from the chemical species that etches the film, is required to be formed uniformly in the plane without clogging the opening in the film. In addition, the protection region is preferably formed on the side wall surface that defines the opening having a high aspect ratio.

In an embodiment, a method of etching a film is provided. The film is an organic film. The organic film has a side wall surface and a bottom surface that define an opening. The method includes (i) forming a precursor layer on the organic film, and (ii) etching the organic film by an oxygen species generated from an oxygen-containing gas. In etching of the organic film, the precursor layer is oxidized by the oxygen species from the oxygen-containing gas to form a protection region.

In the method according to an embodiment, the protection region is formed from the precursor layer. Therefore, the opening in the organic film may be suppressed from being clogged by the protection region. Further, the protection region may be formed uniformly in the plane. In addition, the protection region may also be formed on the side wall surface that defines the opening having a high aspect ratio. In this method, the precursor layer is oxidized by the oxygen species from the oxygen-containing gas which etches the organic film, so that the protection region is formed. Therefore, a process changing the precursor layer into the protection region is performed simultaneously with the etching of the organic film. The precursor layer can be, for example, a monomolecular layer.

In an embodiment, the precursor may contain silicon. In an embodiment, the precursor may contain metal. The metal may be either tungsten or titanium.

In an embodiment, the method may further include a step of forming the opening in the organic film.

In an embodiment, the step of forming the precursor layer and the step of etching the organic film may be alternately repeated.

In an embodiment, the step of forming the precursor layer and the step of etching the organic film may be performed in a depressurized space continuously maintained in a chamber of a single plasma processing apparatus without carrying out a substrate having the organic film from the chamber.

In an embodiment, the plasma processing apparatus may be a capacitively coupled plasma processing apparatus. The plasma processing apparatus may include the chamber, a support, a gas supply unit, a first high-frequency power source, and a second high-frequency power source. The support includes a lower electrode and is configured to support the substrate in the chamber. The gas supply unit is configured to supply a precursor gas including a precursor and the oxygen-containing gas into the chamber. An upper electrode is provided above the support. The first high-frequency power source is configured to supply the upper electrode with first high-frequency electric power for producing plasma. The second high-frequency power source is configured to supply the lower electrode with second high-frequency electric power for drawing ions into a substrate.

In an embodiment, a method of etching a film is provided. The film has a side wall surface and a bottom surface that define an opening. The method includes (i) forming a precursor layer on the film, and (ii) etching the film by a chemical species generated from a processing gas. In the step of etching the film, a protection region is formed from the precursor layer by a chemical species generated from the processing gas or the plasma, or by a separate chemical species generated from the processing gas or the plasma.

In the method according to an embodiment, the protection region is formed from the precursor layer. Therefore, the opening in the film may be suppressed from being clogged by the protection region. Further, the protection region may be formed uniformly in the plane. In addition, the protection region may also be formed on the side wall surface that defines the opening having a high aspect ratio. In this method, the precursor layer is transformed by a chemical species from plasma, which is produced to etch the film, or by a separate chemical species from the plasma, and as a result, the protection region is formed. Therefore, a process for changing the precursor layer into the protection region is performed simultaneously with the etching of the film.

In an embodiment, the film may be a low dielectric constant film including silicon, carbon, oxygen, and hydrogen. The precursor may include silicon. The chemical species that etches the film may include a fluorine species and a nitrogen species. In the method according to the embodiment, the precursor is nitrided by the nitrogen species.

In an embodiment, the film may be a low dielectric constant film including silicon, carbon, oxygen, and hydrogen. The precursor may include a metal. The chemical species that etches the film may include a fluorine species and a nitrogen species. In the method according to the embodiment, the separate chemical species may include an oxygen species. In the method according to the embodiment, the precursor can be oxidized by the oxygen species. The metal may be tungsten or titanium.

In an embodiment, the film may be a polycrystalline silicon film. The precursor may include silicon or metal. The chemical species that etches the film may include a halogen species. The separate chemical species may include an oxygen species. In the method according to the embodiment, the precursor is oxidized by the oxygen species. The metal may also be tungsten or titanium.

In an embodiment, the film may be a silicon nitride film. The precursor may include silicon or metal. The chemical species that etches the film may include a chemical species formed from hydrofluorocarbon in the processing gas. The separate chemical species may include an oxygen species. In the method according to the embodiment, the precursor is oxidized by the oxygen species. The metal may be either tungsten or titanium.

In another embodiment, a plasma processing apparatus is provided. The plasma processing apparatus has a chamber, a support, a gas supply unit, a plasma producing unit, and a controller. The support is configured to support a substrate in the chamber. The gas supply unit is configured to supply a precursor gas including a precursor and a processing gas into the chamber. The plasma producing unit is configured to produce plasma from the processing gas. The controller is configured to control the gas supply unit to supply the precursor gas into the chamber in order to form a precursor layer on the film on the substrate supported on the support. In addition, the controller is configured to control the gas supply unit and the plasma producing unit to supply the processing gas into the chamber and produce the plasma from the processing gas in order to etch the film and form a protection region by transforming the precursor layer.

According to a method of etching a film according to an embodiment, the protection region, which protects the side wall surface from the chemical species that etches the film, is formed uniformly in the plane without clogging the opening of the film. In addition, the protection region may be formed on the side wall surface that defines the opening having a high aspect ratio.

Hereinafter, various embodiments will be described in detail with reference to the drawings. Further, in the respective drawings, like reference numerals denote like parts or corresponding parts.

Figure 2:
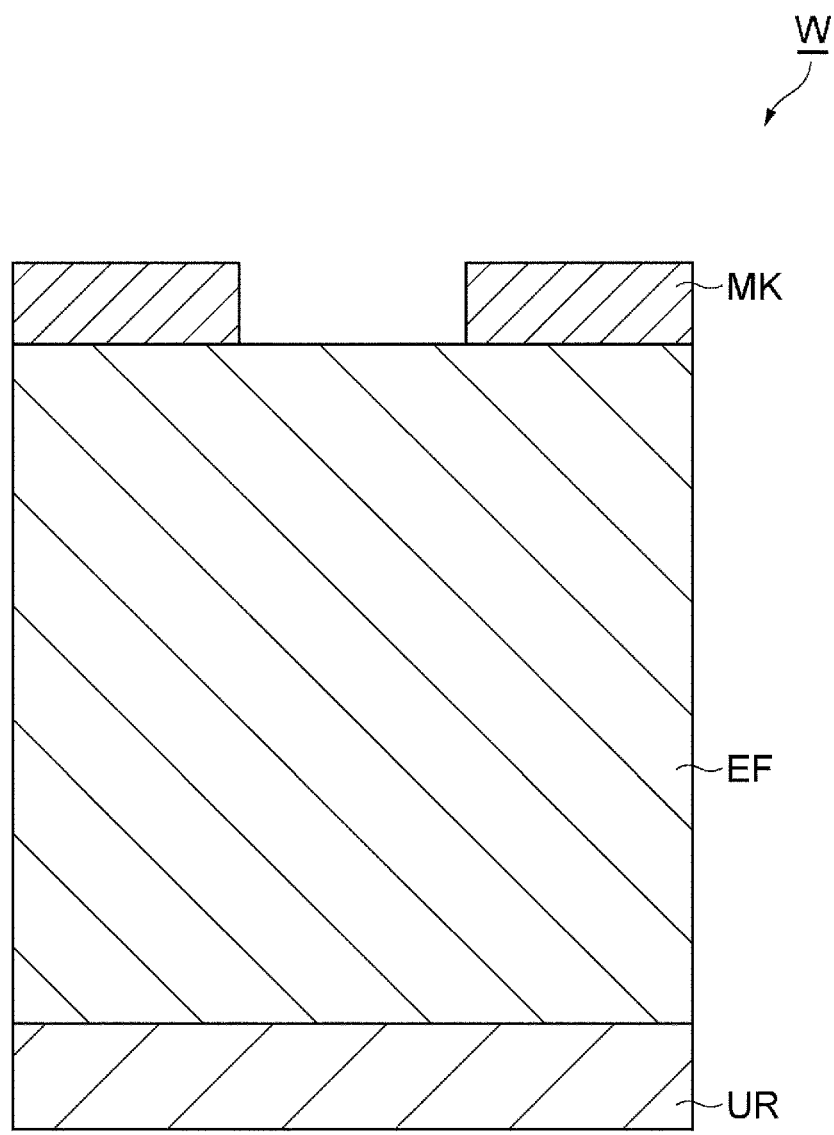
FIG. 2 is a partially enlarged cross-sectional view of an example of a substrate.

FIG. 1 is a flowchart illustrating a method of etching a film according to an embodiment. The method MT illustrated in FIG. 1 is performed to etch a film on a substrate. FIG. 2 is a partially enlarged cross-sectional view of an example of the substrate. A substrate W illustrated in FIG. 2 has a film EF. The substrate W may have an underlying region UR and a mask MK.

The film EF is formed on the underlying region UR. The mask MK is provided on the film EF. The mask MK is patterned. That is, the mask MK has one or more openings. The film EF is partially exposed from the opening of the mask MK. The film EF may be made of any suitable material. The mask MK may be made of any suitable material as long as the film EF is selectively etched with respect to the mask MK in step ST3 to be described below.

In a first example of the substrate W, the film EF is an organic film. In the first example of the substrate W, the mask MK is a silicon-containing film. The silicon-containing film is, for example, an antireflection film containing silicon.

In a second example of the substrate W, the film EF is a low dielectric constant film and includes silicon, carbon, oxygen, and hydrogen. That is, in the second example of the substrate W, the film EF is an SiCOH film. In the second example of the substrate W, the mask MK is formed as a metal-containing film such as a tungsten-containing film or a titanium-containing film. In the second example of the substrate W, the mask MK may be formed as an organic film such as a photoresist film, a silicon nitride film, or a polysilicon film.

In a third example of the substrate W, the film EF is a polycrystalline silicon film. In the third example of the substrate W, the mask MK is formed as a metal-containing film such as a tungsten-containing film. In the third example of the substrate W, the mask MK may be formed as an organic film such as a photoresist film, or a silicon nitride film.

In a fourth example of the substrate W, the film EF is a silicon nitride film. In the fourth example of the substrate W, the mask MK is formed as a metal-containing film such as a tungsten-containing film or a titanium-containing film. In the fourth example of the substrate W, the mask MK may be formed as an organic film such as a photoresist film or a polysilicon film.

Figure 3:
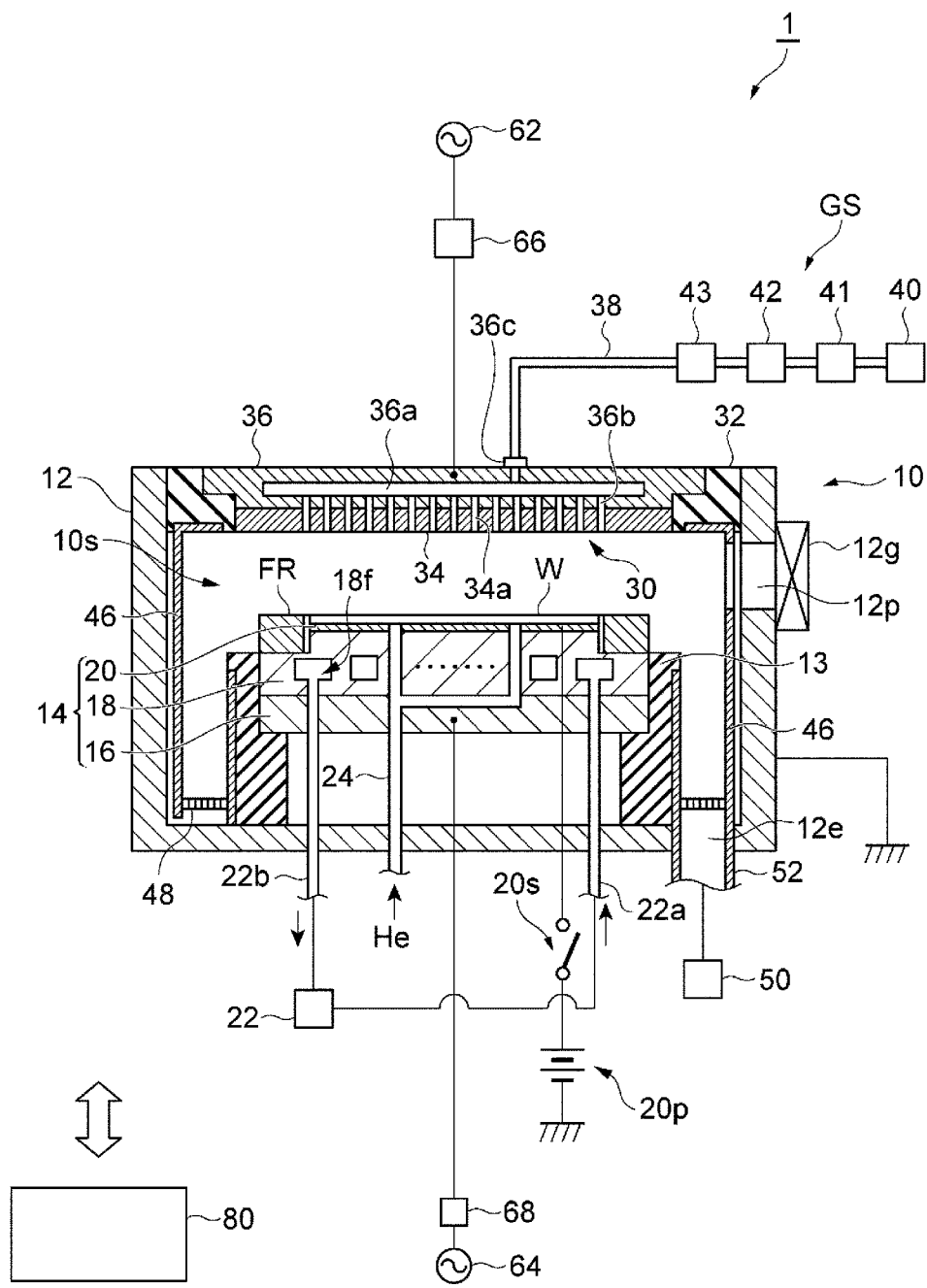
FIG. 3 is a view schematically illustrating a plasma processing apparatus according to an embodiment.

As illustrated in FIG. 1, method MT includes a step ST1 and a step ST3. In an embodiment, method MT is performed by using the plasma processing apparatus. FIG. 3 is a view schematically illustrating the plasma processing apparatus according to an embodiment. A plasma processing apparatus 1 illustrated in FIG. 3 is a capacitively coupled plasma processing apparatus.

The plasma processing apparatus 1 has a chamber 10. The chamber 10 has therein an internal space 10s. The chamber 10 includes a chamber main body 12. The chamber main body 12 has an approximately cylindrical shape. The internal space 10s is provided in the chamber main body 12. The chamber main body 12 is made of, for example, aluminum. A film having corrosion resistance is formed on an inner wall surface of the chamber main body 12. The film having corrosion resistance may be a film made of ceramics such as aluminum oxide or yttrium oxide.

A passageway 12p is formed in a sidewall of the chamber main body 12. The substrate W passes through the passageway 12p when the substrate W is transported between the internal space 10s and the outside of the chamber 10. The passageway 12p is openable or closable by a gate valve 12g. The gate valve 12g is provided along the sidewall of the chamber main body 12.

A support unit 13 is provided on a bottom portion of the chamber main body 12. The support unit 13 is made of an insulating material. The support unit 13 has an approximately cylindrical shape. The support unit 13 extends upward in the internal space 10s from the bottom portion of the chamber main body 12. The support unit 13 has a support 14. The support 14 is provided in the internal space 10s. The support 14 is configured in the chamber 10, that is, in the internal space 10s to support the substrate W.

The support 14 has a lower electrode 18 and an electrostatic chuck 20. The support 14 may further include an electrode plate 16. The electrode plate 16 is made of a conductor such as, for example, aluminum and has an approximately disk shape. The lower electrode 18 is provided on the electrode plate 16. The lower electrode 18 is made of a conductor such as, for example, aluminum and has an approximately disk shape. The lower electrode 18 is electrically connected to the electrode plate 16.

The electrostatic chuck 20 is provided on the lower electrode 18. The substrate W is placed on an upper surface of the electrostatic chuck 20. The electrostatic chuck 20 has a main body and an electrode. The main body of the electrostatic chuck 20 has an approximately disk shape and is made of a dielectric material. The electrode of the electrostatic chuck 20 is an electrode in the form of a film and provided in the main body of the electrostatic chuck 20. The electrode of the electrostatic chuck 20 is connected to a direct current power source 20p through a switch 20s. When a voltage is applied to the electrode of the electrostatic chuck 20 from the direct current power source 20p, electrostatic attractive force is generated between the electrostatic chuck 20 and the substrate W. The substrate W is attracted to the electrostatic chuck 20 by the generated electrostatic attractive force, and the substrate W is retained by the electrostatic chuck 20.

A focus ring FR is disposed on a circumferential edge portion of the lower electrode 18 in order to surround an edge of the substrate W. The focus ring FR is provided to improve in-plane uniformity of the plasma processing performed on the substrate W. The focus ring FR may be made of, but not limited to, silicon, silicon carbide, or quartz.

A flow path 18f is provided in the lower electrode 18. A heat exchange medium (e.g., coolant) is supplied into the flow path 18f through a pipe 22a from a chiller unit 22 provided outside the chamber 10. The heat exchange medium supplied into the flow path 18f returns back to the chiller unit 22 through the pipe 22b. In the plasma processing apparatus 1, a temperature of the substrate W placed on the electrostatic chuck 20 is adjusted by heat exchange between the heat exchange medium and the lower electrode 18.

In the plasma processing apparatus 1, a gas supply line 24 is provided. The gas supply line 24 supplies heat transfer gas (e.g., He gas) from a heat transfer gas supply mechanism to a portion between an upper surface of the electrostatic chuck 20 and a rear surface of the substrate W.

The plasma processing apparatus 1 further includes an upper electrode 30. The upper electrode 30 is provided above the support 14. The upper electrode 30 is supported at an upper side of the chamber main body 12 by a member 32. The member 32 is made of an insulating material. The upper electrode 30 and the member 32 close an upper opening of the chamber main body 12.

The upper electrode 30 may include a top plate 34 and a support body 36. A lower surface of the top plate 34 is a lower surface directed toward the internal space 10s, and the lower surface of the top plate 34 defines the internal space 10s. The top plate 34 may be made of a semiconductor or a low-resistance conductor with low Joule heat. Multiple gas discharge holes 34a are formed in the top plate 34. The multiple gas discharge holes 34a penetrate the top plate 34 in a direction of a plate thickness of the top plate 34.

The support body 36 supports the top plate 34 so that the top plate 34 is detachable. The support body 36 is made of a conductive material such as aluminum. A gas diffusion chamber 36a is provided in the support body 36. Multiple gas holes 36b are formed in the support body 36. The multiple gas holes 36b extend downward from the gas diffusion chamber 36a. The multiple gas holes 36b are in communication with the multiple gas discharge holes 34a, respectively. A gas introducing port 36c is formed in the support body 36. The gas introducing port 36c is connected to the gas diffusion chamber 36a. A gas supply pipe 38 is connected to the gas introducing port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 constitute a gas supply unit GS. The gas source group 40 includes multiple gas sources. The multiple gas sources of the gas source group 40 include sources of multiple gases used for method MT. Each of the valve group 41 and the valve group 43 includes multiple opening-closing valves. The flow rate controller group 42 includes multiple flow rate controllers. Each of the multiple flow rate controllers of the flow rate controller group 42 is a mass flow controller or a pressure-control flow rate controller. Each of the multiple gas sources of the gas source group 40 is connected to the gas supply pipe 38 through the corresponding opening-closing valve of the valve group 41, the corresponding flow rate controller of the flow rate controller group 42, and the corresponding opening-closing valve of the valve group 43.

In the plasma processing apparatus 1, a shield 46 is detachably provided along the inner wall surface of the chamber main body 12. The shield 46 is also provided around an outer circumference of the support unit 13. The shield 46 prevents etching by-product from being attached to the chamber main body 12. The shield 46 is configured by forming a corrosion-resistant film on a surface of a base material made of, for example, aluminum. The corrosion-resistant film may be a film made of ceramics such as yttrium oxide.

A baffle plate 48 is provided between the support unit 13 and the sidewall of the chamber main body 12. The baffle plate 48 is configured by forming a corrosion-resistant film on a surface of a base material made of, for example, aluminum. The corrosion-resistant film may be a film made of ceramics such as yttrium oxide. Multiple through holes are formed in the baffle plate 48. A gas discharge port 12e is provided below the baffle plate 48 and in the bottom portion of the chamber main body 12. A gas discharge device 50 is connected to the gas discharge port 12e through a gas discharge pipe 52. The gas discharge device 50 has a pressure regulating valve, and a vacuum pump such as a turbo molecular pump.

The plasma processing apparatus 1 further includes a first high-frequency power source 62 and a second radio frequency power source 64. The first radio frequency power source 62 is a power source that generates first radio frequency electric power. The first radio frequency electric power has a frequency suitable for producing plasma. The frequency of the first radio frequency electric power is, for example, a frequency within a range of 27 MHz to 100 MHz. The first radio frequency power source 62 is connected to the upper electrode 30 through a matching device 66 and the electrode plate 16. The matching device 66 has a circuit for matching output impedance of the first radio frequency power source 62 with impedance at a load side (upper electrode 30 side). Further, the first radio frequency power source 62 may be connected to the lower electrode 18 through the matching device 66. The first radio frequency power source 62 constitutes an example of the plasma producing unit.

The second radio frequency power source 64 is a power source that generates second radio frequency electric power. The second radio frequency electric power has a frequency lower than the frequency of the first radio frequency electric power. When the second radio frequency electric power is used together with the first radio frequency electric power, the second radio frequency electric power is used as bias radio frequency electric power for drawing ions into the substrate W. The frequency of the second radio frequency electric power is, for example, a frequency within a range of 400 kHz to 13.56 MHz. The second radio frequency power source 64 is connected to the lower electrode 18 through a matching device 68 and the electrode plate 16. The matching device 68 has a circuit for matching output impedance of the second radio frequency power source 64 and impedance at a load side (lower electrode 18 side).

The plasma may be produced by using the second radio frequency electric power without using the first radio frequency electric power, that is, by using only single radio frequency electric power. In this case, the frequency of the second radio frequency electric power may be a frequency higher than 13.56 MHz, for example, a frequency of 40 MHz. In this case, the plasma processing apparatus 1 may have neither the first radio frequency power source 62 nor the matching device 66. In this case, the second radio frequency power source 64 constitutes an example of the plasma producing unit.

In the plasma processing apparatus 1, gas is supplied into the internal space 10s from the gas supply unit GS to produce the plasma. In addition, a radio frequency electric field is produced between the upper electrode 30 and the lower electrode 18 as the first radio frequency electric power and/or the second radio frequency electric power is supplied. The gas is excited by the produced radio frequency electric field. As a result, the plasma is produced.

The plasma processing apparatus 1 may further include a controller 80. The controller 80 may be a computer including, for example, a processor, a storage unit such as a memory, an input device, a display device, and a signal input-output interface. The controller 80 controls respective parts of the plasma processing apparatus 1. The controller 80 may allow an operator to perform an operation of inputting a command to manage the plasma processing apparatus 1 by using the input device. In addition, the controller 80 may visibly display an operational situation of the plasma processing apparatus 1 through the display device. Further, the storage unit of the controller 80 stores a control program and recipe data. The control program is executed by the processor of the controller 80 to perform various types of processing by using the plasma processing apparatus 1. The processor of the controller 80 executes the control program and controls the respective parts of the plasma processing apparatus 1 depending on the recipe data, such that method MT is performed by the plasma processing apparatus 1.

Method MT will be described in detail with reference back to FIG. 1. In the following description, method MT will be described with reference to an example in which the substrate W illustrated in FIG. 2 is processed by using the plasma processing apparatus 1. Further, other plasma processing apparatuses may be used for method MT. Method MT may process other substrates.

Method MT is performed in a state in which the substrate W is placed on the support 14. In an embodiment, method MT starts with step STa. In step STa, the film EF is etched by plasma etching.

In step STa, plasma PLa is produced from processing gas in the chamber 10. In a case where the aforementioned first example of the substrate W is processed, that is, in a case where the film EF of the substrate W is an organic film, the processing gas used in step STa may include an oxygen-containing gas. For example, the oxygen-containing gas includes oxygen gas, carbon monoxide gas, or carbon dioxide gas. Alternatively, in the case where the first example of the substrate W is processed, the processing gas used in step STa may include nitrogen gas and/or hydrogen gas.

In a case where the aforementioned second example of the substrate W is processed, that is, in a case where the film EF of the substrate W is a low dielectric constant film, the processing gas used in step STa may include a fluorine-containing gas. For example, the fluorine-containing gas is a fluorocarbon gas. For example, the fluorocarbon gas is $C_4F_8$ gas.

In a case where the aforementioned third example of the substrate W is processed, that is, in a case where the film EF of the substrate W is a polycrystalline silicon film, the processing gas used in step STa may include a halogen-containing gas. For example, the halogen-containing gas is HBr gas, $Cl_2$ gas, or $SF_6$ gas.

In a case where the aforementioned fourth example of the substrate W is processed, that is, in a case where the film EF of the substrate W is a silicon nitride film, the processing gas used in step STa may include a hydrofluorocarbon gas. For example, the hydrofluorocarbon gas is $CH_3F$ gas.

Figure 4A:
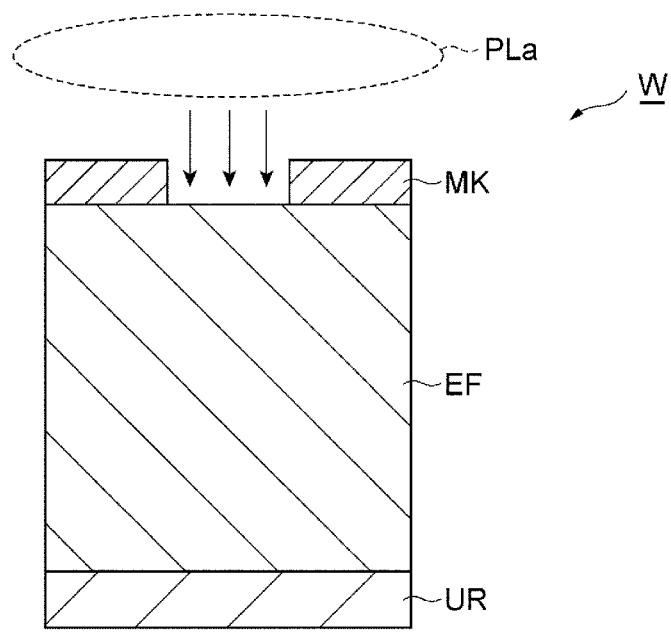
FIG. 4A is a view for explaining an example of step STa of the method illustrated in FIG. 1.
Figure 4B:
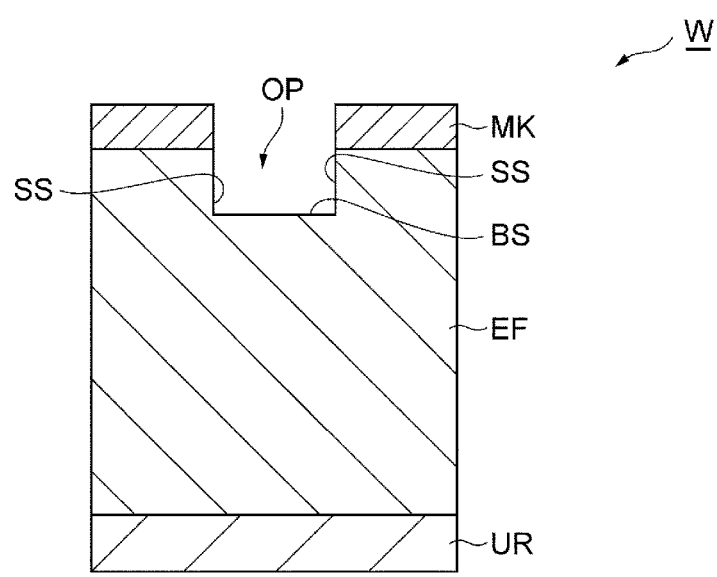
FIG. 4B is a partially enlarged cross-sectional view of an example of the substrate in a state after step STa is performed.

In step STa, as illustrated in FIG. 4A, a chemical species from the plasma PLa enters the film EF, such that the film EF is etched by the chemical species. In step STa, the film EF is etched to a position between a lower surface of the film EF and an upper surface of the film EF. The lower surface of the film EF is a surface of the film EF which is in contact with the underlying region UR. The upper surface of the film EF is a surface of the film EF which is exposed from an opening of the mask MK. When step STa is performed, an opening OP is formed in the film EF, as illustrated in FIG. 4B. The opening OP is defined by a side wall surface SS and a bottom surface BS of the film EF.

In step STa, the controller 80 controls the gas discharge device 50 to set pressure in the internal space 10s to predetermined pressure. In step STa, the controller 80 controls the gas supply unit GS to supply the processing gas into the internal space 10s. In step STa, the controller 80 controls the plasma producing unit to produce the plasma from the processing gas. In step STa according to an embodiment, the controller 80 controls the first radio frequency power source 62 and/or the second radio frequency power source 64 to supply the first radio frequency electric power and/or the second radio frequency electric power.

The plasma etching in step STa may be plasma etching identical to plasma etching in step ST3 to be described below. In this case, regarding details of the plasma etching in step STa and control by the controller 80 in step STa, see the description of step ST3.

Further, method MT may not include step STa. In this case, the opening OP is formed in advance in the film EF of the substrate to which method MT is applied.

Figure 5:
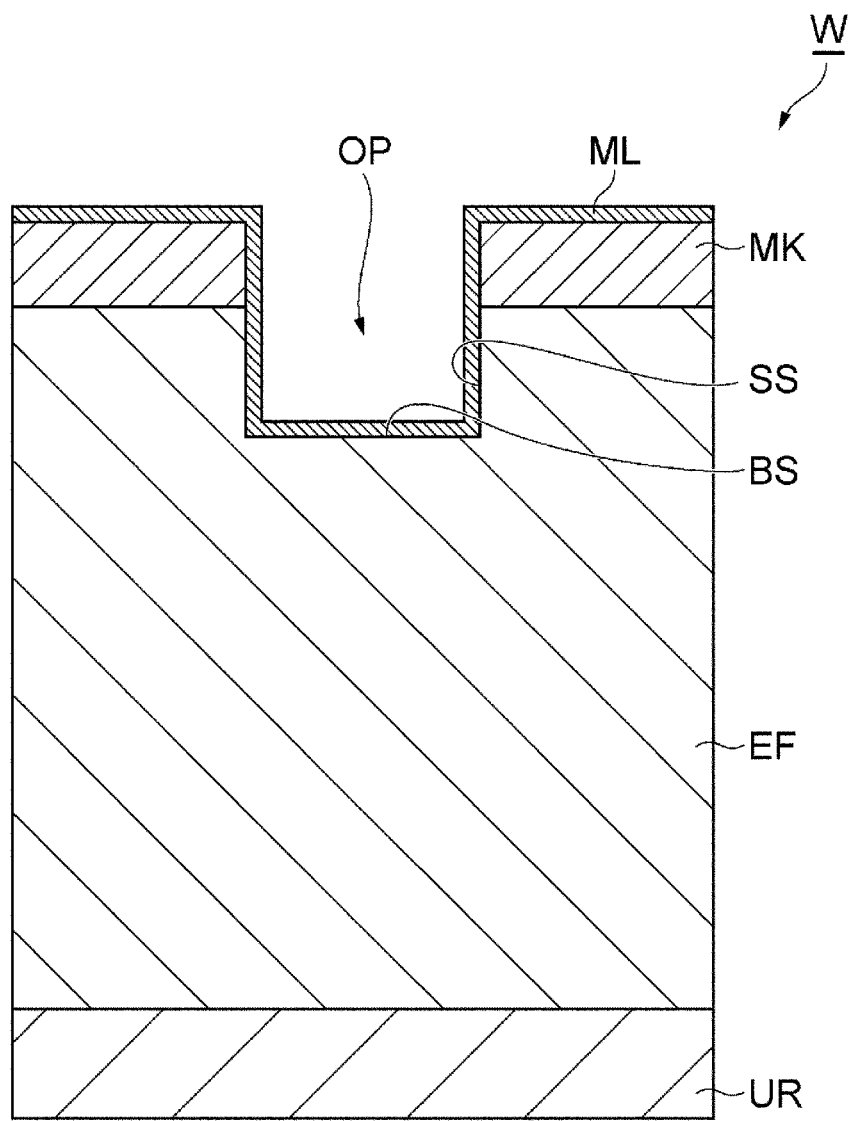
FIG. 5 is a partially enlarged cross-sectional view of an example of the substrate in a state after step ST1 of the method illustrated in FIG. 1 is performed.

In method MT, step ST1 is performed. In step ST1, as illustrated in FIG. 5, a monomolecular layer ML of a precursor is formed on the substrate W. The monomolecular layer is an example of a precursor layer formed by adsorption of the precursor. The monomolecular layer ML is formed on the side wall surface SS and the bottom surface BS. The monomolecular layer ML is also formed on the mask MK. The precursor, which constitutes the monomolecular layer ML, may be any precursor as long as the precursor forms a protection region PR by being transformed while step ST3 to be described below is performed, and as long as the protection region PR protects the side wall surface SS from an active species that etches the film EF.

In step ST1, precursor gas including a precursor is supplied onto the substrate W having the opening OP. In an embodiment, the precursor gas is supplied into the internal space 10s. In step ST1, a carrier gas, together with the precursor gas, may be supplied. The carrier gas may be an inert gas. For example, the inert gas is a rare gas or nitrogen gas. No plasma is produced in the chamber 10 while step ST1 is performed.

Even in a case where any one of the aforementioned first to fourth examples of the substrate W is processed, the precursor gas used in step ST1 is a silicon-containing gas or a metal-containing gas. The silicon-containing gas includes a silicon-containing substance as the precursor. For example, the silicon-containing gas is aminosilane gas. The metal-containing gas includes a metal-containing substance as the precursor. For example, the metal-containing substance includes tungsten or titanium. For example, the metal-containing gas is a tungsten-containing gas or a titanium-containing gas. The tungsten-containing gas may be tungsten halide gas such as tungsten hexafluoride gas or tungsten hexachloride gas. The titanium-containing gas may be titanium halide gas such as titanium tetrafluoride gas or titanium tetrachloride gas.

In step ST1, the controller 80 controls the gas discharge device 50 to set pressure in the internal space 10s to predetermined pressure. In step ST1, the controller 80 controls the gas supply unit GS to supply the precursor gas into the internal space 10s. In step ST1, a carrier gas, together with the precursor gas, may be supplied. The carrier gas may be inert gas. For example, the inert gas is rare gas or nitrogen gas.

In method MT, step ST2 may be performed between step ST1 and step ST3. In step ST2, the internal space 10s is purged. In step ST2, the controller 80 controls the gas discharge device 50 to discharge the gas in the internal space 10s. In step ST2, the controller 80 may control the gas supply unit GS to supply the inert gas into the internal space 10s. As step ST2 is performed, the precursor gas in the internal space 10s is replaced with the inert gas. When step ST2 is performed, a surplus precursor adsorbed onto the substrate W may be removed. In this case, as the precursor gas is supplied in step ST1 and the internal space 10s is purged in step ST2, the monomolecular layer ML is consequently formed.

Figure 6A:
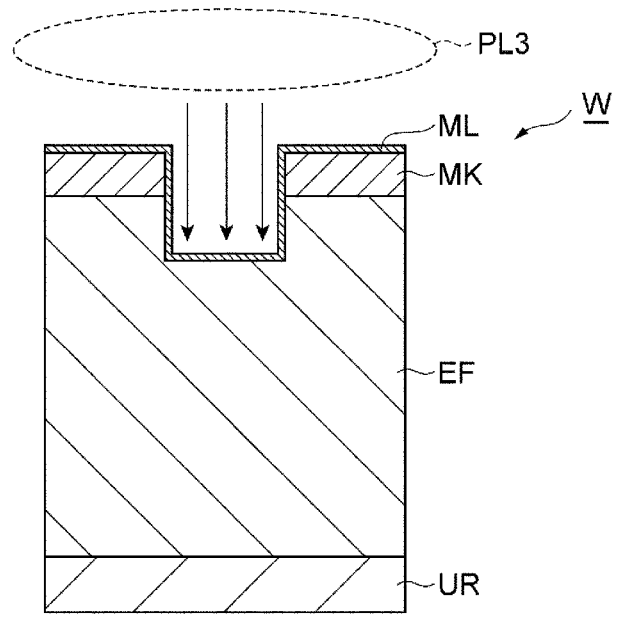
FIG. 6A is a view for explaining an example of step ST3 of the method illustrated in FIG. 1.
Figure 6B:
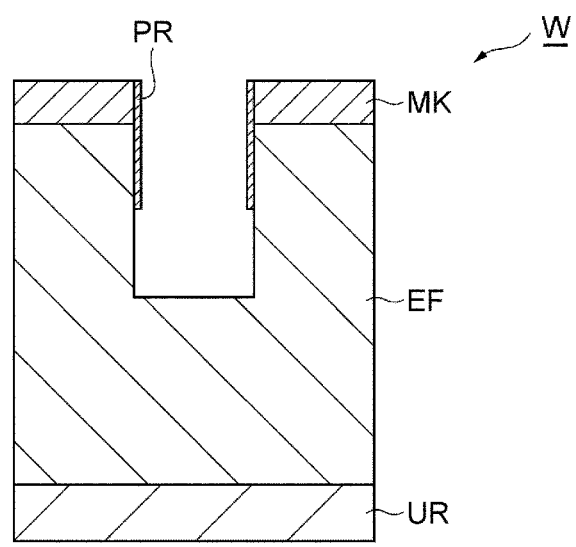
FIG. 6B is a partially enlarged cross-sectional view of an example of the substrate in a state after step ST3 is performed.

In step ST3, the film EF is etched by plasma etching. In step ST3, plasma PL3 is produced from processing gas in the chamber 10. In step ST3, an active species from the plasma from the processing gas enters the film EF as illustrated in FIG. 6A, and the film EF is etched as illustrated in FIG. 6B. In step ST3, the chemical species, which etches the film EF, or a separate chemical species from the plasma PL3 reacts with the precursor in the monomolecular layer ML, so that the protection region PR is formed from the monomolecular layer ML.

In the case where the aforementioned first example of the substrate W is processed, that is, in the case where the film EF of the substrate W is an organic film, the processing gas used in step ST3 may include an oxygen-containing gas. For example, the oxygen-containing gas includes oxygen gas, carbon monoxide gas, or carbon dioxide gas. In step ST3, the processing gas may further include carbonyl sulfide gas. In the case where the first example of the substrate W is processed, the film EF is etched by the oxygen species from the plasma PL3. In addition, the protection region PR is formed as the oxygen species from the plasma PL3 reacts with the precursor in the monomolecular layer ML. In a case where the precursor in the monomolecular layer ML is a silicon-containing substance, the protection region PR is made of silicon oxide. In a case where the precursor in the monomolecular layer ML is a metal-containing substance, the protection region PR is made of metal oxide (e.g., tungsten oxide or titanium oxide).

In the case where the aforementioned second example of the substrate W is processed, that is, in the case where the film EF of the substrate W is a low dielectric constant film, the processing gas used in step ST3 includes fluorine and nitrogen. For example, the processing gas includes a fluorocarbon gas and a nitrogen-containing gas. For example, the fluorocarbon gas is $C_4F_8$ gas. For example, the nitrogen-containing gas is nitrogen gas ($N_2$ gas). The processing gas may further include rare gas (e.g., Ar gas) and oxygen gas ($O_2$ gas). In the case where the second example of the substrate W is processed, the film EF is etched by a fluorine species and a nitrogen species from the plasma PL3. In the case where the precursor in the monomolecular layer ML is a silicon-containing substance, in step ST3, the protection region PR is formed as the nitrogen species from the plasma PL3 reacts with the silicon-containing substance in the monomolecular layer ML. In this case, the protection region PR is made of silicon nitride. In the case where the precursor in the monomolecular layer ML is a metal-containing substance, in step ST3, the protection region PR is formed as the oxygen species from the plasma PL3 reacts with the metal-containing substance in the monomolecular layer ML. In this case, the protection region PR is made of metal oxide (e.g., tungsten oxide or titanium oxide). Further, the oxygen species from the plasma PL3 reduces the amount of carbon-containing deposits formed on the substrate W in step ST3.

In the case where the aforementioned third example of the substrate W is processed, that is, in the case where the film EF of the substrate W is a polycrystalline silicon film, the processing gas used in step ST3 may include a halogen-containing gas and an oxygen-containing gas. The halogen-containing gas is HBr gas, $Cl_2$ gas, or $SF_6$ gas. For example, the oxygen-containing gas includes oxygen gas, carbon monoxide gas, or carbon dioxide gas. In the case where the third example of the substrate W is processed, the film EF is etched by a halogen species from the plasma PL3. In addition, the protection region PR is formed as the oxygen species from the plasma PL3 reacts with the precursor in the monomolecular layer ML. In a case where the precursor in the monomolecular layer ML is a silicon-containing substance, the protection region PR is made of silicon oxide. In the case where the precursor in the monomolecular layer ML is a metal-containing substance, the protection region PR is made of metal oxide (e.g., tungsten oxide or titanium oxide).

In the case where the aforementioned fourth example of the substrate W is processed, that is, in the case where the film EF of the substrate W is a silicon nitride film, the processing gas used for the step ST3 may include a hydrofluorocarbon gas and an oxygen-containing gas. For example, the hydrofluorocarbon gas is $CH_3F$ gas. For example, the oxygen-containing gas includes oxygen gas, carbon monoxide gas, or carbon dioxide gas. The processing gas used in step ST3 may further include rare gas (e.g., Ar gas). In the case where the fourth example of the substrate W is processed, the film EF is etched by a chemical species formed from a hydrofluorocarbon gas in the processing gas. In addition, the protection region PR is formed as the oxygen species from the plasma PL3 reacts with the precursor in the monomolecular layer ML. In the case where the precursor in the monomolecular layer ML is a silicon-containing substance, the protection region PR is made of silicon oxide. In the case where the precursor in the monomolecular layer ML is a metal-containing substance, the protection region PR is made of metal oxide (e.g., tungsten oxide or titanium oxide). Further, the oxygen species from the plasma PL3 reduces the amount of carbon-containing deposits formed on the substrate W in step ST3.

In step ST3, the controller 80 controls the gas discharge device 50 to set pressure in the internal space 10s to predetermined pressure. In step ST3, the controller 80 controls the gas supply unit GS to supply the processing gas into the internal space 10s. In step ST3, the controller 80 controls the plasma producing unit to produce the plasma from the processing gas. In step ST3 according to an embodiment, the controller 80 controls the first radio frequency power source 62 and/or the second radio frequency power source 64 to supply the first radio frequency electric power and/or the second radio frequency electric power.

In method MT, step ST4 may be performed after step ST3 is performed. In step ST4, the internal space 10s is purged. Step ST4 is the same as step ST2.

Figure 7:
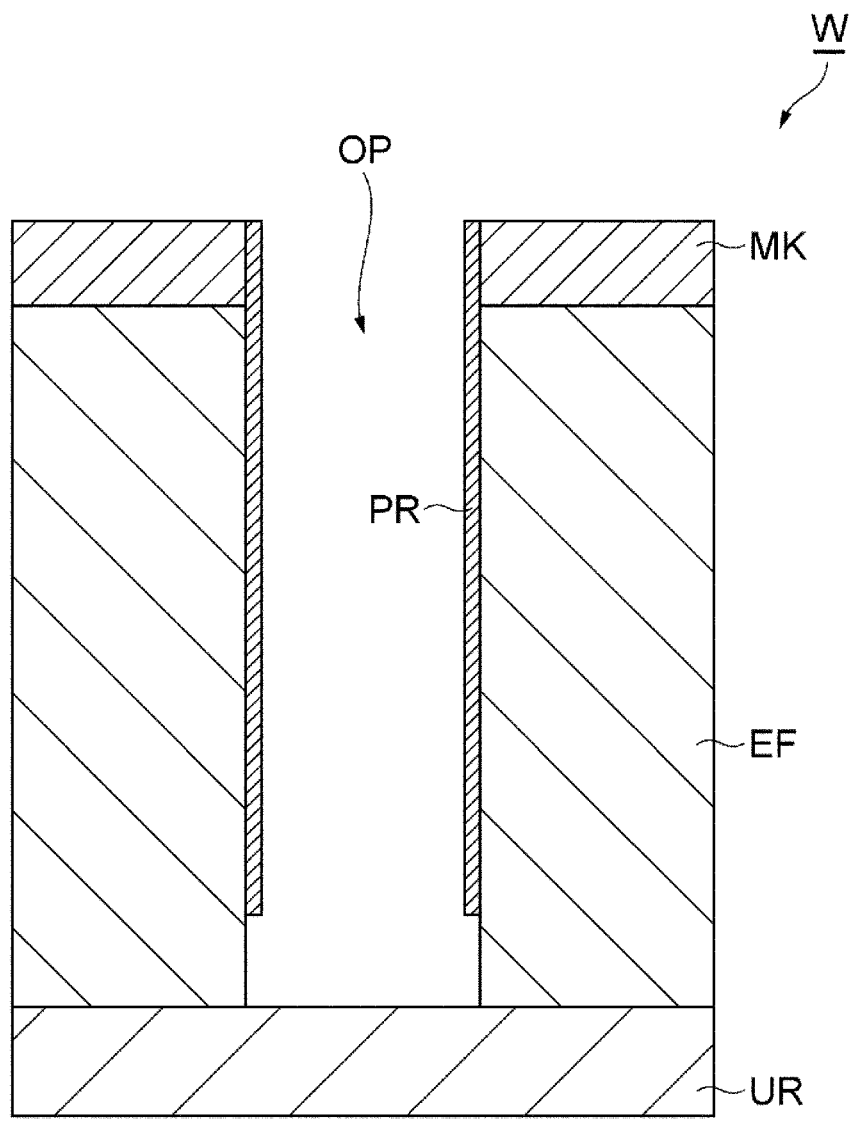
FIG. 7 is a partially enlarged cross-sectional view of an example of the substrate in a state after the method illustrated in FIG. 1 is performed.

In a subsequent step ST5, it is determined whether a stop condition is satisfied. The stop condition is determined as being satisfied when the number of times step ST1 and step ST3 are alternately repeated reaches a predetermined number of times. When it is determined in step ST5 that the stop condition is not satisfied, the processing from step ST1 is performed again. As step ST1 and step ST3 are alternately repeated, a depth of the opening OP is consequently increased. For example, as illustrated in FIG. 7, the opening OP is formed to reach a surface of the underlying region UR. When it is determined in step ST5 that the stop condition is satisfied, method MT is completed. Further, the sequence including the step ST1 and the step ST3 may be performed only once. In this case, the step ST5 need not be performed.

In method MT, the side wall surface SS is protected by the protection region PR while the film EF is etched (i.e., while step ST3 is performed). Therefore, the side wall surface SS is etched by the chemical species that etches the film EF, and as a result, the opening OP is suppressed from being spread in a lateral direction (i.e., a direction orthogonal to the direction of the film thickness of the film EF). Further, in the entire region of the monomolecular layer ML, a region of the monomolecular layer ML, which extends on the film EF, and a region of the monomolecular layer ML, which extends on the upper surface of the mask MK, are etched while step ST3 is performed, because ion flux directed toward these regions is large.

As described above, in method MT, the protection region PR is formed from the monomolecular layer ML. Therefore, the opening in the film EF may be suppressed from being clogged by the protection region PR. In addition, the protection region PR may be formed uniformly in the plane. In addition, the protection region PR may also be formed on the side wall surface that defines the opening OP having a high aspect ratio. In method MT, the chemical species from the plasma PL3 produced to etch the film EF or the separate chemical species from the plasma PL3 transforms the monomolecular layer, and as a result, the protection region PR is formed. Therefore, the processing for changing the monomolecular layer ML to the protection region PR is performed simultaneously with the etching of the film EF.

In an embodiment, as described above, step ST1 and step ST3 may be performed in the internal space 10s without removing the substrate W from the chamber 10. That is, method MT may be performed in the depressurized space continuously maintained in the chamber of the single plasma processing apparatus without removing the substrate W from the chamber.

While the various embodiments have been described above, the present disclosure is not limited to the aforementioned embodiments, and the embodiments may be omitted, replaced, and changed in various manners. In addition, other embodiments may be implemented by combining elements in different embodiments.

For example, an apparatus used for performing step ST1 and a plasma processing apparatus used for performing step ST3 may be different from each other. A plasma apparatus used for performing step STa may also differ from the apparatus used for performing step ST1 and the plasma processing apparatus used for performing step ST3.

In addition, the plasma processing apparatus used for performing method MT may be a plasma processing apparatus of any type. For example, the plasma processing apparatus used for performing method MT may be an inductively coupled plasma processing apparatus or a plasma processing apparatus that uses surface waves such as microwaves to produce plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of etching an organic film, comprising:
providing a substrate having the organic film formed thereon, in which the organic film comprises a side wall surface and a bottom surface that define an opening;
forming a precursor layer on the organic film; and
etching the organic film by an oxygen species generated from an oxygen-containing gas, the method further comprising, during the etching of the organic film, oxidizing the precursor layer by the oxygen species generated from the oxygen-containing gas to form a protection region.

2. The method of claim 1, wherein the precursor layer contains silicon.

3. The method of claim 1, wherein the precursor layer contains a metal.

4. The method of claim 3, wherein the metal is either tungsten or titanium.

5. The method of claim 1, further comprising:
forming the opening in the organic film.

6. The method of claim 1, wherein the forming of the precursor layer and the etching of the organic film are alternately repeated.

7. The method of claim 1, further including performing the forming of the precursor layer and the etching of the organic film in a depressurized space continuously maintained in a chamber of a single plasma processing apparatus without removing the substrate having the organic film from the chamber.

8. The method of claim 7, further including using as the single plasma processing apparatus a capacitively coupled plasma processing apparatus which includes:
the chamber;
a support including a lower electrode and which supports the substrate in the chamber;
a gas supply unit which supplies a gaseous precursor and the oxygen-containing gas into the chamber;
an upper electrode located above the support;
a first radio frequency power source which supplies a first radio frequency power to the upper electrode for generating plasma; and
a second radio frequency power source which supplies a second radio frequency power to the lower electrode for drawing ions into the substrate.

9. The method of claim 1, further including performing the etching of the organic film and the oxidizing of the precursor layer using a plasma formed with the oxygen-containing gas.

10. The method of claim 1, wherein the etching of the organic film and oxidizing of the precursor is performed after forming the precursor layer.

11. A method of etching a film, comprising:
providing a substrate having the film formed thereon, in which the film comprises a side wall surface and a bottom surface that define an opening;
forming a precursor layer on the film; and
after forming the precursor, etching the film by a chemical species generated from a processing gas,
the method further comprising, during the etching of the film, forming a protection region from the precursor layer by transforming the precursor layer with an oxygen species, and wherein the oxygen species is the chemical species used to etch the film or by another chemical species from the processing gas.

12. The method of claim 11, wherein the film is a low dielectric constant film including silicon, carbon, oxygen, and hydrogen,
the precursor layer includes silicon, and
the chemical species that etches the film includes a fluorine species and a nitrogen species.

13. The method of claim 11, wherein the film is a low dielectric constant film including silicon, carbon, oxygen, and hydrogen,
the precursor layer includes a metal, and
the chemical species that etches the film includes a fluorine species and a nitrogen species.

14. The method of claim 13, wherein the metal is either tungsten or titanium.

15. The method of claim 11, wherein the film is a polycrystalline silicon film,
the precursor layer includes silicon or a metal,
the chemical species that etches the film includes a halogen species.

16. The method of claim 15, wherein the precursor layer includes the metal, and the metal is either tungsten or titanium.

17. The method of claim 11, wherein the film is a silicon nitride film,
the precursor layer includes silicon or a metal,
the chemical species that etches the film includes a chemical species formed from hydrofluorocarbon in the processing gas.

18. The method of claim 17, wherein the precursor layer includes the metal, and the metal is either tungsten or titanium.

19. The method of claim 11, further including performing the etching of the film and the forming of the protection region using with a plasma formed with the processing gas.

20. The method of claim 11, wherein the film is an organic film.

21. A method of etching, comprising:
providing, in a chamber, a substrate having a film including a side wall surface and a bottom surface that define an opening;
forming a precursor layer on the opening of the film; and
after forming the precursor, generating a plasma to form a protective film on the side wall surface, and to etch the bottom surface of the film;
wherein the substrate includes a mask above the film, the plasma simultaneously forms the protective film on the side wall surface and etches the bottom surface of the film, and wherein:
the protective film is formed with a species of the plasma reacting with the precursor layer which was previously formed on the side wall; and
the bottom surface of the film is etched through the mask and through the opening of the film to etch the bottom surface of the film at a bottom of the opening.

22. The method of claim 21, further comprising alternately repeating the forming and the generating.

23. The method of claim 22, wherein the forming and the generating are performed without carrying out the substrate from a depressurized space.

24. The method of claim 21,
wherein the film includes an organic film, the precursor layer and the protective film include silicon, and the species of the plasma which reacts with the precursor layer includes oxygen species.

25. A method of etching an organic film comprising:
providing a substrate having the organic film formed thereon, the organic film including a side wall surface and a bottom surface that define an opening with the bottom surface being a bottom of the opening;
forming a precursor layer at least on the side wall surface of the opening of the organic film; and
after forming the precursor layer, etching the organic film by a process gas including oxygen or nitrogen, and forming a plasma with the processing gas, and wherein during the etching:
(a) oxidizing the precursor layer by an oxygen species generated from the processing gas or nitriding the precursor layer by a nitrogen species generated from the processing gas, and the oxidizing or the nitriding of the precursor layer forms a protection region at least on the side wall surface of the opening of the organic film; and
(b) etching the organic film through the opening to etch the bottom surface of the organic film at the bottom of the opening.

26. The method of claim 25, wherein the protection region is formed simultaneous with the etching of the organic film.

27. The method of claim 25, wherein the etching further includes:
(i) applying a first high frequency power to a processing chamber in which the substrate is located to form a plasma; and
(ii) applying a second high frequency power to draw ions into the substrate.

28. The method of claim 25, wherein the substrate includes a mask above the organic film having a mask opening, and the forming of the precursor layer includes forming the precusor layer on a mask side wall of the mask opening in addition to the side wall of the organic film; and
the etching of the bottom surface of the organic film includes etching the bottom surface through both the mask opening and the opening of the organic film while simultaneously oxidizing or nitriding the precursor layer.

* * * * *